United States Patent
Park et al.

(10) Patent No.: US 7,310,469 B2
(45) Date of Patent: Dec. 18, 2007

(54) WAVEGUIDE PIN PHOTODIODE HAVING GRADED INDEX DISTRIBUTION CENTERING AROUND OPTICAL ABSORPTION LAYER

(75) Inventors: Sahng Gi Park, Daejeon (KR); Eun Deok Sim, Daejeon (KR); Jeong Woo Park, Daejeon (KR); Jae Sik Sim, Daejeon (KR); Yong Soon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/481,580

(22) Filed: Jul. 6, 2006

(65) Prior Publication Data

US 2007/0133636 A1    Jun. 14, 2007

(30) Foreign Application Priority Data

Dec. 10, 2005    (KR) ...................... 10-2005-0121242

(51) Int. Cl.
G02B 6/10 (2006.01)
G02B 6/26 (2006.01)
H04B 10/06 (2006.01)

(52) U.S. Cl. .......................... 385/131; 385/39; 385/43; 398/214

(58) Field of Classification Search ................ 385/131, 385/17
See application file for complete search history.

(56) References Cited

U.S. PATENT DOCUMENTS

| | | | | |
|---|---|---|---|---|
| 3,821,777 A | * | 6/1974 | James | 257/186 |
| 4,258,375 A | * | 3/1981 | Hsieh et al. | 257/186 |
| 4,750,183 A | * | 6/1988 | Takahashi et al. | 372/45.012 |
| 4,999,844 A | * | 3/1991 | Imamoto | 372/45.012 |
| 5,289,484 A | * | 2/1994 | Hayakawa | 372/45.01 |
| 5,298,762 A | * | 3/1994 | Ou | 257/13 |
| 5,479,427 A | * | 12/1995 | Yoshida et al. | 372/45.01 |
| 5,998,851 A | | 12/1999 | Nishikata | |
| 6,472,691 B2 | * | 10/2002 | Mukaihara et al. | 257/115 |
| 6,646,317 B2 | | 11/2003 | Takeuchi | |
| 6,734,519 B1 | | 5/2004 | Nakaji et al. | |
| 2004/0135136 A1 | * | 7/2004 | Takahashi et al. | 257/14 |
| 2006/0165349 A1 | * | 7/2006 | Demiguel et al. | 385/30 |
| 2006/0198404 A1 | * | 9/2006 | Henrichs | 372/29.02 |

OTHER PUBLICATIONS

'Design, Optimization, and Fabrication of Side-Illuminated p-i-n Photodetectors With High Responsivity and High Alignment Tolerance for 1.3- and 1.55-μm Wavelength Use' Magnin et al., Journal of Lightwave Technology, vol. 20, No. 3, Mar. 2002, pp. 477-488.
'Very High-Responsivity Evanescently Coupled Photodiodes Integrating a Short Planar Multimode Waveguide for High-Speed Applications' Demiguel et al., IEEE Photonics Technology Letters, vol. 15, No. 12, Dec. 2003, pp. 1761-1763.
'Design and Fabrication of a Waveguide Photodiode for 1.55-μm-Band Access Receivers' Takeuchi et al., Jpn. J. Appl. Phys. vol. 38 (1999) pp. 1211-1214, Part 1, No. 2B, Feb. 1999.

* cited by examiner

*Primary Examiner*—Michelle Connelly-Cushwa
*Assistant Examiner*—Kajli Prince
(74) *Attorney, Agent, or Firm*—Ladas & Parry LLP

(57) ABSTRACT

A waveguide PIN photodiode is provided. The waveguide PIN photodiode includes a lower light guide layer, a light absorption layer, an upper light guide layer, and a cladding layer. The lower light guide is formed on a substrate, and the light absorption layer is formed on the lower light guide layer. The upper light guide layer is formed on the light absorption layer, and the cladding layer is formed on the upper light guide layer. The lower light guide layer, the light absorption layer, and the upper light guide layer constitute a core layer, which is an optical waveguide, and graded index distribution is symmetrically formed in a depth direction, centering around the light absorption layer having a highest refractive index.

9 Claims, 5 Drawing Sheets

WAVEGUIDE PIN PHOTODIODE HAVING GRADED INDEX DISTRIBUTION CENTERING AROUND OPTICAL ABSORPTION LAYER

CROSS-REFERENCE TO RELATED PATENT APPLICATION

This application claims the benefit of Korean Patent Application No. 10-2005-0121242, filed on Dec. 10, 2005, in the Korean Intellectual Property Office, the disclosure of which is incorporated herein in its entirety by reference.

BACKGROUND OF THE INVENTION

1. Field of the Invention

The present invention relates to a photodiode, and more particularly, to a waveguide PIN (p-type, intrinsic, n-type) photodiode.

2. Description of the Related Art

Photodiodes are essential parts in local area optical networks such as wavelength division multiplexing (WDM)-passive optical networks (PONs) and e-PONs. Research on optical communication technologies is being actively pursued and ultra-high technology optical communication is widely used for a long distance back-bone network. However, coaxial cables are used as the main communication means for local area access networks, i.e., data communication between a base station and a general household or an office.

Generally, since local area access networks have many users, it is estimated that a full range of good quality services will be available to users when optical communication technologies will be fully developed. The communication speed of the local area optical network is expected to reach several hundreds of MHz to several GHz (e.g., 1.25 or 2.5 GHz). The most actively investigated photodiodes are a high-speed PIN photodiode having a light-receiving bandwidth of 40 GHz or more and an avalanche photodiode having a high gain rate. On the other hand, a waveguide PIN photodiode having a low speed less than 5 GHz is still not available on the market due to high package costs and low demand.

It is expected that the demand for receivers will rapidly increase when the local area optical communication market is revitalized in the near future. Accordingly, it is certain that the demand for low-speed waveguide PIN photodiodes that can be used to manufacture inexpensive receivers for local area optical communication will also increase. In this regard, low-speed waveguide PIN photodiodes should have high responsivity, high coupling coefficient when coupled to a single-mode optical fiber, high alignment tolerance, and low package costs.

SUMMARY OF THE INVENTION

The present invention provides a waveguide PIN photodiode having a low speed less than 5 GHz, high responsivity, a high coupling coefficient when coupled to a single-mode optical fiber, high alignment tolerance, and low package costs.

According to an aspect of the present invention, there is provided a waveguide PIN photodiode including: a lower light guide layer formed on a substrate; a light absorption layer formed on the lower light guide layer; an upper light guide layer formed on the light absorption layer; and a cladding layer formed on the upper light guide layer.

According to an aspect of the present invention, the lower light guide layer, the light absorption layer, and the upper light guide layer may constitute a core layer, which is an optical waveguide, and a graded index distribution may be symmetrically formed in a depth direction, centering around the light absorption layer having a highest refractive index. The symmetrical graded index distribution may have a curve shape of a Lorentz function.

The lower light guide layer may include an n-diluted index layer formed on the substrate, an n-1.1Q layer formed on the n-diluted index layer to have a higher refractive index than that of the n-diluted index layer, and a lower u-1.3Q layer formed on the n-1.1Q layer to have a higher refractive index than the n-1.1Q layer; and the upper light guide layer may include an upper u-1.3Q layer formed on the light absorption layer, a p-1.1Q layer formed on the upper u-1.3Q layer to have a lower refractive index than the upper u-1.3Q layer, and a p-diluted index layer formed on the p-1.1Q layer to have a lower refractive index than the p-1.1Q layer. The upper u-1.3Q layer, the lower u-1.3Q layer, the p-1.1Q layer, and the n-1.1Q layer will be described later.

The upper u-1.3Q layer, the lower u-1.3Q layer, the p-1.1Q layer, the n-1.1Q layer, the p-diluted index layer, and the n-diluted index layer may have the same refractive indexes.

The n-diluted index layer may be a semiconductor layer formed by stacking a plurality of pairs of layers, each pair consisting of a material layer of the substrate and a material layer of the n-1.1Q layer, and controlling a refractive index; and the p-diluted index layer may be a semiconductor layer formed by stacking a plurality of pairs of layers, each pair consisting of a material layer of the cladding layer and a material layer of the p-1.1Q layer.

The n-diluted index layer and the n-1.1Q layer may be semiconductor layers (n-type semiconductor layers) doped with n-type impurities, the lower u-1.3Q layer, the light absorption layer, and the lower u-1.3Q layer are intrinsic semiconductor layers (i-layers) undoped with impurities, and the p-diluted index layer and the p-1.1Q layer may be semiconductor layers (p-type semiconductor layers) doped with p-type impurities.

The waveguide PIN photodiode according to the present invention has symmetrical graded index distribution centering around the light absorption layer, so that the waveguide PIN photodiode may have a maximum coupling coefficient when coupled to a plane-cut single-mode optical fiber or a silica waveguide.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
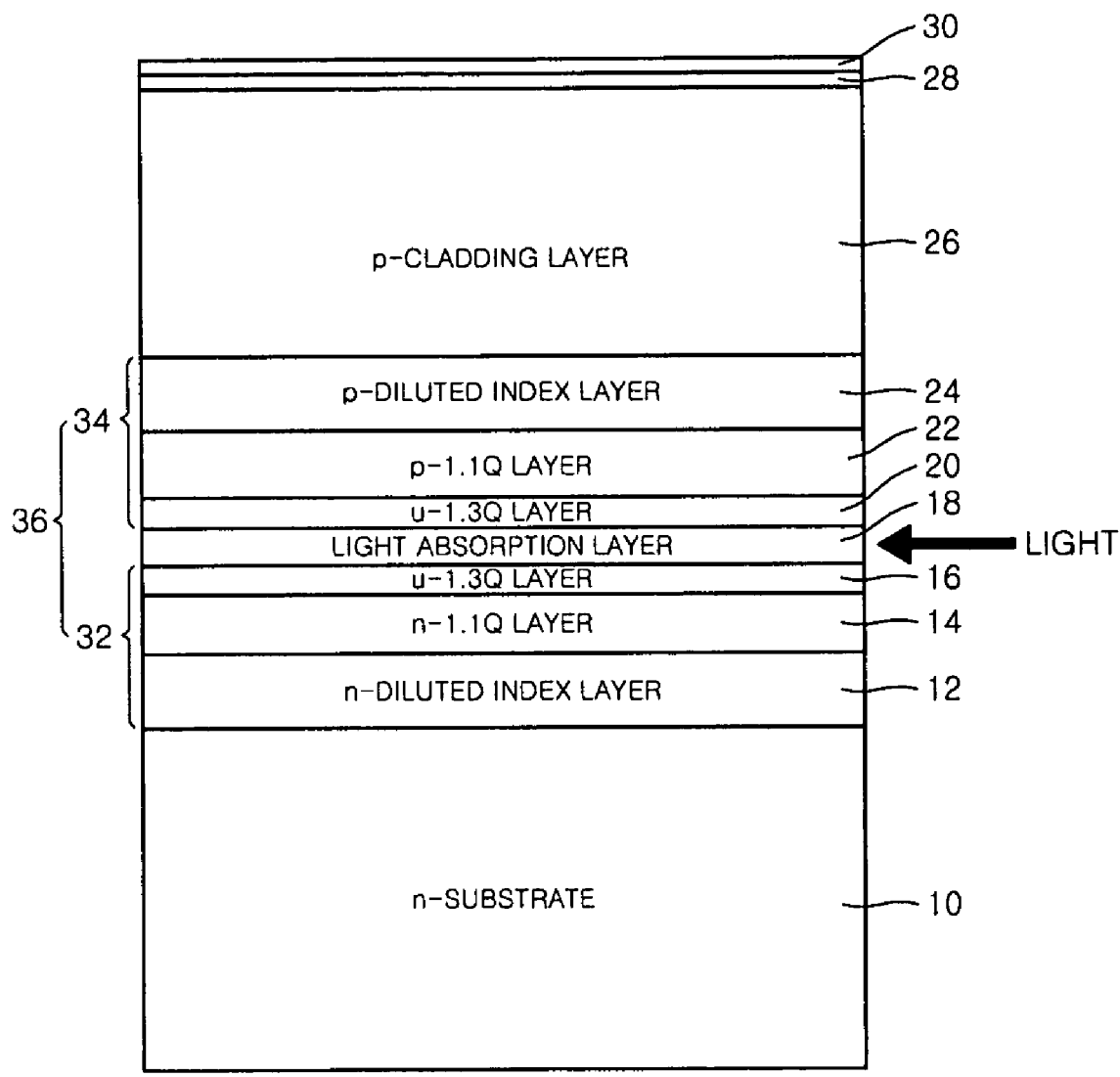
FIG. 1 is a cross-sectional view of a waveguide PIN photodiode according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

FIG. 1 is a sectional view of a waveguide PIN photodiode according to an embodiment of the present invention.

In detail, FIG. 1 illustrates a cross-section of a crystal growth of the waveguide PIN photodiode of FIG. 1. The waveguide PIN photodiode includes a light absorption layer 18 formed on a substrate 10, for example, in a central portion on an InP substrate. The light absorption layer 18 may be formed of InGaAs undoped with impurities and having a thickness of 0.1-1 μm, preferably, 0.5 μm.

An upper u-1.3Q layer 20 and a lower u-1.3Q layer 16 are formed on the upper surface and the lower surface of the light absorption layer 18, respectively. In the above description, "u" means that there are no impurities, and "Q" represents a band gap wavelength, 1.3 means that the gap wavelength of the layers 20 and 16 is 1.3 μm. The upper u-1.3Q layer 20 and the lower u-1.3Q layer 16 are formed of InGaAsP undoped with impurities and having a thickness of 0.2 μm. The light absorption layer 18, the upper u-1.3Q layer 20, and the lower u-1.3Q layer 16 constitute an i layer (intrinsic semiconductor layer) of the PIN photodiode. Though the total thickness of the light absorption layer 18, the upper u-1.3Q layer 20, and the lower u-1.3Q layer 16 constituting the i layer is 0.9 μm according to the present embodiment, the total thickness may be 0.1-2 μm.

A p-1.1Q layer 22 and an n-1.1Q layer 14 are formed on the upper surface of the upper u-1.3Q layer 20 and the lower surface of the lower u-1.3Q layer 16, respectively. The p-1.1Q layer 22 is formed of InGaAsP doped with p-type impurities and having a thickness of 0.5 μm, and the n-1.1Q layer 14 is formed of InGaAsP doped with n-type impurities and having a thickness of 0.5 μm. As above, 1.1 means that the band gap wavelength of the layers 22 and 14 is 1.1 μm. Accordingly, the p-1.1Q layer 22 and an n-1.1Q layer 14 have smaller refractive indexes than those of the upper u-1.3Q layer 20 and the lower u-1.3Q layer 16, respectively.

A p-diluted index layer 24 and an n-diluted index layer 12 are formed on the upper surface of the p-1.1Q layer 22 and the lower surface of the n-1.1Q layer 14, respectively. The p-diluted index layer 24 is formed of InGaAsP doped with p-type impurities and having a thickness of 1.05 μm, and the n-diluted index layer 12 is formed of InGaAsP doped with n-type impurities and having a thickness of 1.05 μm. The p-diluted index layer 24 and the n-diluted index layer 12 have smaller refractive indexes than those of the p-1.1Q layer 22 and the n-1.1Q layer 14, respectively. A method of forming the p-diluted index layer 24 and the n-diluted index layer 12 and structures of the diluted index layers 24 and 12 will be described with reference to FIG. 2, according to an embodiment of the present invention.

A p-cladding layer 26 is formed on the p-diluted index layer 24. The p-cladding layer 26 is formed of InP doped with p-type impurities and having a thickness of 2.1 μm. The p-cladding layer 26 is formed to have a smaller refractive index than that of the p-diluted index layer 24. A p-electrode 28 (P+ electrode) is formed on the p-cladding layer 26. The p-electrode 28 is formed of InGaAs doped with p-type impurities and having a thickness of 0.2 μm. A protective layer 30 is formed on the p-electrode 28. The protective layer 30 is formed of a nitride layer in a thickness of 0.2 μm. According to an embodiment of the present invention, the p-type impurities are provided by doping a substrate with Zn in a concentration of $5 \times 10^{17}/cm^3$, and the n-type impurities are provided by doping a substrate with Si in a concentration of $1 \times 10^{18}/cm^3$.

In the present embodiment, a core layer 36 includes the light absorption layer 18, an upper light guide layer 34, and a lower light guide layer 32 formed on the upper surface and the lower surface of the light absorption layer 18, respectively. The upper light guide layer 34 includes the upper u-1.3Q layer 20, the p-1.1Q layer 22, and the p-diluted index layer 24. The lower light guide layer 32 includes the lower u-1.3Q layer 16, the n-1.1Q layer 14, and the n-diluted index layer 12. The core layer 36 has a thickness of 3-5 μm, preferably 4 μm.

In the present embodiment, the n-diluted index layer 12 and the n-1.1Q layer 14 are semiconductor layers (n-type semiconductor layers) doped with n-type impurities; the lower u-1.3Q layer 16, the light absorption layer 18, and the lower u-1.3Q layer 20 are intrinsic semiconductor layers (i layers) undoped with impurities; and the p-diluted index layer 24 and the p-1.1Q layer 22 are semiconductor layers (p-type semiconductor layers) doped with p-type impurities.

In the present embodiment, light is absorbed into the light absorption layer 18, and the light is guided through the core layer 36. Particularly, the refractive index of the waveguide PIN photodiode has symmetrical graded index distribution centering around the light absorption layer 18. In the present embodiment, the PIN photodiode having the symmetrical graded index distribution may have a maximum coupling coefficient when coupled to a plane-cut single-mode optical fiber or a silica waveguide, which will be described in detail later.

Measurement results of the responsivity in coupling between the PIN photodiode of the present invention and a plane-cut single-mode optical fiber, carried out by the inventors of the present invention, show that the responsivity 0.97 A/W, which is higher than a reported maximum value 0.95 A/W, is obtained. Also, the inventors of the present invention have measured a responsivity of 1.194 A/W, which is higher than a reported maximum value of 1.186 A/W in coupling between the PIN photodiode of the present invention and a lens type single-mode optical fiber. Although, the parameters of elements illustrated in FIG. 1 have an optimized design, the present invention is not limited to these parameters.

Figure 2:
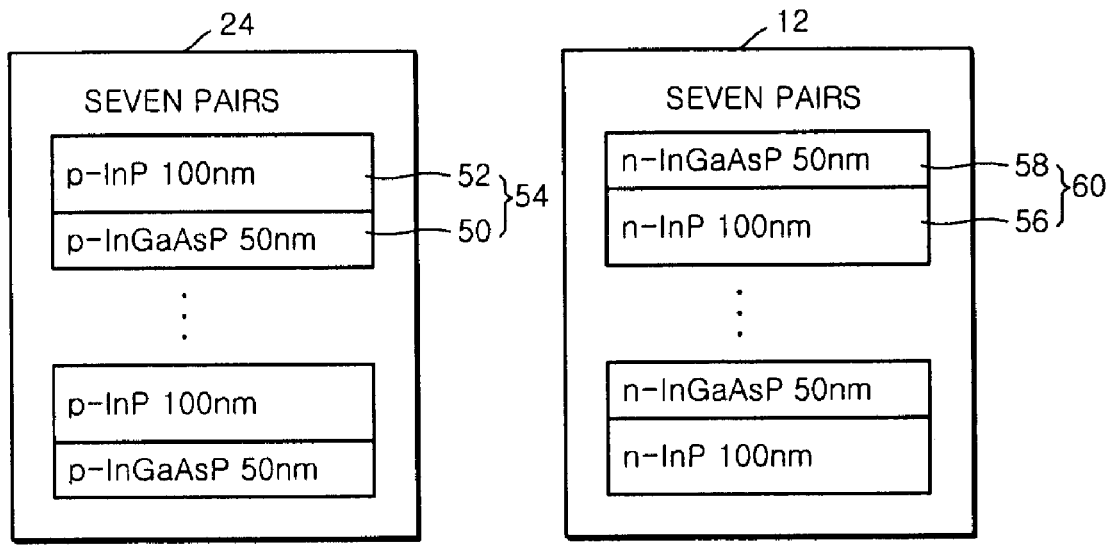
FIG. 2 is a cross-sectional view illustrating a structure of a diluted index layer of FIG. 1.

FIG. 2 is a sectional view illustrating a structure of a diluted index layer of FIG. 1, according to an embodiment of the present invention. In FIG. 2, the same reference numerals are used for the elements shown in FIG. 1.

In detail, the left and right portions of FIG. 2 are views explaining a crystal growth method and the cross-sectional structure of the p-diluted index layer 24 and the n-diluted index layer 12, respectively. The p-diluted index layer 24 may be a semiconductor layer formed by stacking a plurality of layer pairs each layer pair 54 consisting of a p-InP material layer 52 constituting the p-cladding layer 26 and a p-InGaAsP material layer 50 constituting the p-1.1Q layer, and controlling a refractive index. That is, the p-diluted index layer 24 is formed by stacking seven layer pairs each layer pair 54 consisting of a p-InGaAsP layer 50 of 50 nm and a p-InP layer 52 of 100 nm. The p-diluted index layer 24 formed in this manner has an intermediate refractive index between the refractive index of the p-cladding layer 26 and the refractive index of the p-1.1Q layer 22.

The n-diluted index layer 12 may be a semiconductor layer formed by stacking a plurality of layer pairs each layer pair 60 consisting of an p-InP material layer 56 constituting the substrate and an n-InGaAsP material layer 58 constituting the n-1.1Q layer, and controlling a refractive index. That is, the n-diluted index layer 12 is formed by stacking seven layer pairs each layer pair 60 consisting of an n-InGaAsP layer 58 of 50 nm and an n-InP layer 56 of 100 nm. The n-diluted index layer 12 formed in this manner has an intermediate refractive index between the refractive index of the n-substrate 10 and the refractive index of the n-1.1Q layer 14. Eventually, the p-diluted index layer 24 and the n-diluted index layer 12 are essential elements in the waveguide PIN photodiode having a symmetrical graded index.

Figure 3:
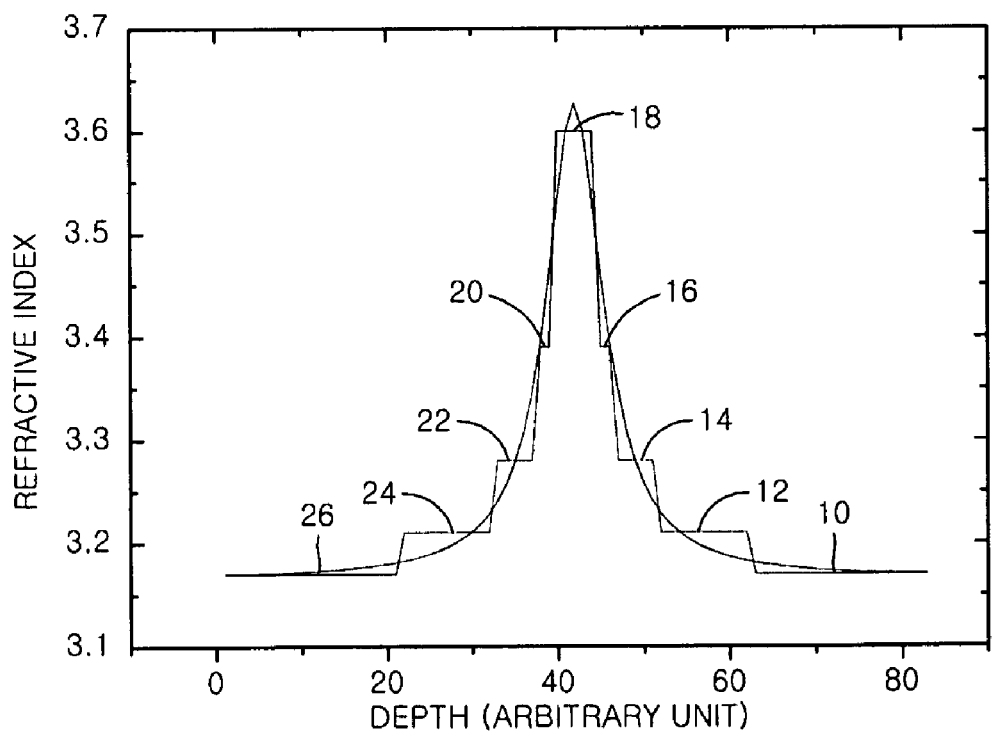
FIG. 3 is a graph illustrating a refractive index versus the depth of the waveguide PIN photodiode of FIG. 1.

FIG. 3 is a graph illustrating index distribution versus the depth of the waveguide PIN photodiode of FIG. 1. In FIG. 3, the same reference numerals are used for the same elements of FIG. 1.

In detail, the waveguide PIN photodiode according to the present invention has symmetrical graded index distribution depending on a depth centering around the light absorption layer 18. That is, the light absorption layer 18 is located at about a depth 40 and having a highest refractive index 3.6. The upper u-1.3Q layer 20 having a refractive index 3.4, the p-1.1Q layer 22 having a refractive index 3.3, the p-diluted index layer 24 having a refractive index 3.2, and the p-cladding layer 26 having a refractive index 3.15 are sequentially located along an upper surface direction of the light absorption layer 18. Also, the lower u-1.3Q layer 16 having a refractive index 3.4, the n-1.1Q layer 14 having a refractive index 3.3, the n-diluted index layer 12 having a refractive index 3.2, and the n-substrate 10 having a refractive index 3.15 are sequentially located along the depth direction of the light absorption layer 18. That is, the u-1.3Q layer 20 and the lower u-1.3Q layer 16, the p-1.1Q layer 22 and the n-1.1Q layer, and the p-diluted index layer 24 and the n-diluted index layer 12 have the same refractive indexes, respectively.

With reference to the above descriptions and FIG. 3, the PIN photodiode according to the present invention has the symmetrical grade index distribution along the depth centering around the light absorption layer 18. FIG. 3 shows that the index distribution has a curve close to the curve of a Lorentz function. Therefore, according to the waveguide PIN photodiode, a ray is guided by the index distribution having the Lorentz function shape while passing through a waveguide, so that it is possible to obtain a high coupling coefficient in coupling of the waveguide PIN photodiode and a single-mode optical fiber or a silica planar lightwave circuit (PLC) waveguide.

Figure 4:
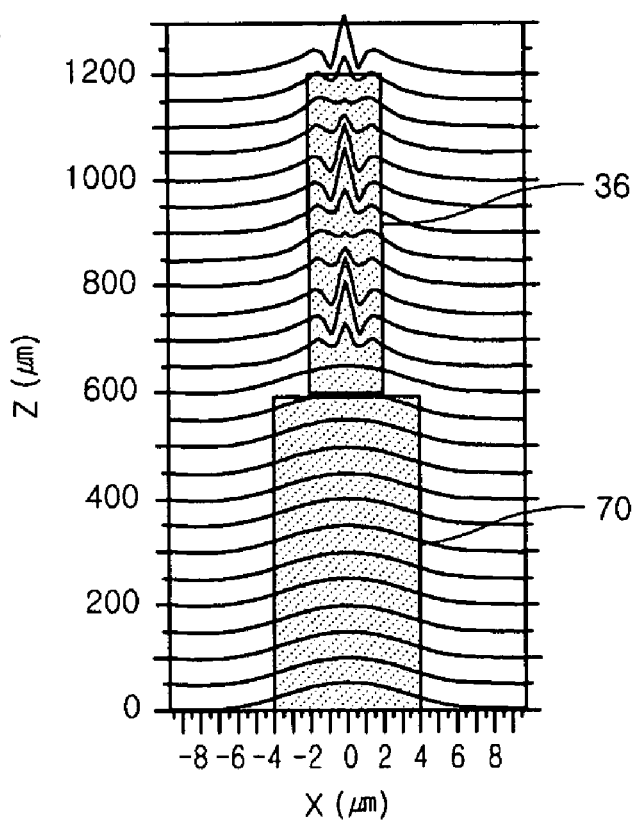
FIGS. 4 and 5 are graphs illustrating a light waveguide profile and coupling loss when the waveguide PIN photodiode of FIG. 1 is coupled to a plane-cut single-mode optical fiber.
Figure 5:
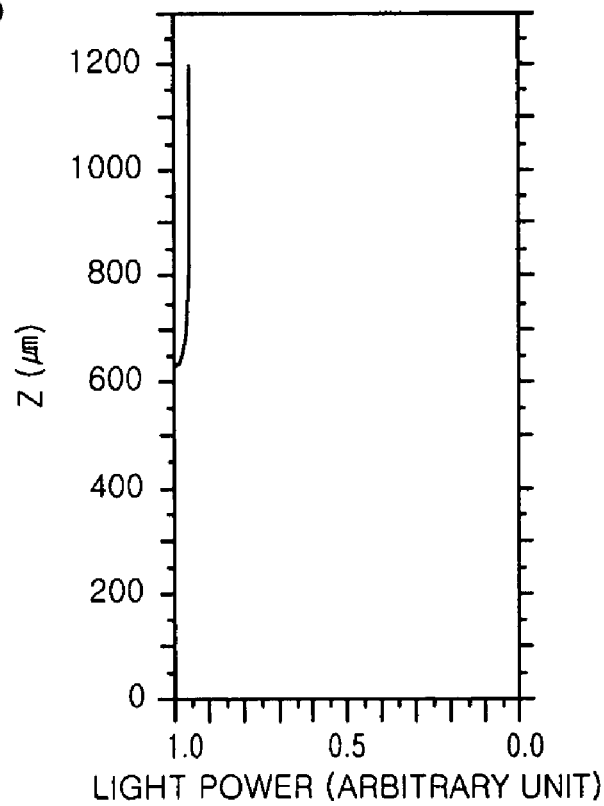

FIGS. 4 and 5 are graphs illustrating a light waveguide profile and coupling loss when the waveguide PIN photodiode of the present invention is coupled to a plane-cut single-mode optical fiber. Referring to FIGS. 4 and 5, the same reference numerals are used for the elements shown in FIG. 1.

In detail, FIG. 4 illustrates computation results of a light waveguide profile obtained using a computer program when the core layer 36 of the waveguide PIN photodiode of the present invention is coupled to the plane-cut single-mode optical fiber 70; and FIG. 5 illustrates computation results of coupling loss obtained using a computer program when the core layer 36 of the waveguide PIN photodiode of the present invention is coupled to the plane-cut single-mode optical fiber 70. Referring to FIGS. 4 and 5, a numerical aperture (NA) of the optical fiber is 0.1, the diameter of the optical fiber is 8 m, a difference between the refractive index of the optical fiber's core layer and that of the optical fiber's cladding layer is 0.01, and the refractive index of the optical fiber is 1.45.

Referring to FIG. 4, the waveguide (the core layer 36 through which light propagates) of the waveguide PIN photodiode is a multimode waveguide allowing two modes, and light intensity at the center of the core layer increases and decreases with an interval of about 200 μm. Therefore, the most effective length of the waveguide PIN photodiode according to the present invention may be about 200 μm. Also, referring to FIG. 5, assuming an interval of 10 μm between the cross-section of the plane-cut single-mode optical fiber 70 and that of the waveguide PIN photodiode, a low coupling loss of about 3% is achieved. In FIG. 5, light power 1.0 means that no coupling loss occurs.

On the other hand, the inventors of the present invention have manufactured waveguide PIN photodiode chips having waveguide lengths 100 μm, 150 μm, 200 μm, and 300 μm, and measured responsivities thereof with respect to light having a wavelength 1.55 μm. The measurement results have shown that the responsivity increases as the waveguide length increases up to 200 μm but no difference was observed when the waveguide length was increased from 200 μm to 300 μm. That is, the responsivity at a length of 100 μm is 0.85 A/W, the responsivity at a length of 150 μm is 0.93 A/W, and the responsivities at lengths of 200 μm and 300 μm are 0.97 A/W.

Also, when waveguide PIN photodiode chips having the light absorption layers 18 whose thicknesses are 0.1 μm and 0.5 μm, respectively, are manufactured and the responsivities thereof are measured, the responsivity is not much different from the case where the length of the waveguide is larger than 200 μm. When the thickness of the light absorption layer 18 is excessively large, most photons are absorbed in the vicinity of an incident surface, which makes the portion of the incident surface vulnerable to high power, and remarkably shortens the life of the light absorption layer 18. A photodiode having the light absorption layer 18 whose thickness is less than 1 μm had excellent properties during stability and breakdown experiments. When the light absorption layer 18 has a thickness 0.03 μm and the length of the waveguide is 300 μm, a responsivity is 0.75 A/W.

From the above results, the optimized design for a waveguide PIN photodiode having a low speed of 1-5 GHz according to the present invention is achieved by symmetric graded index distribution, in which a waveguide length is 100-300 μm, preferably 100-250 μm, the width of the optical waveguide is 8-30 μm, preferably 20 μm, the thickness of the light absorption layer is 0.1-1 μm. Particularly, the optimized waveguide structure of the waveguide PIN photodiode according to the present invention is accomplished by the symmetric graded index distribution, a waveguide's length 200 µm, and the light absorption layer's thickness of 0.1-0.5 µm.

Figure 6:
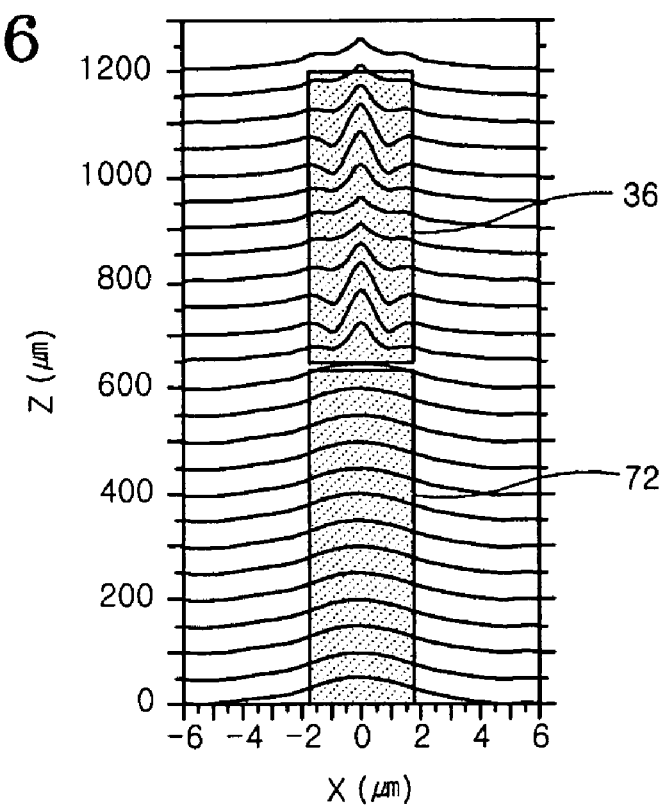
FIGS. 6 and 7 are graphs illustrating a light waveguide profile and coupling loss when the waveguide PIN photodiode of FIG. 1 is coupled to a silica PLC waveguide.
Figure 7:
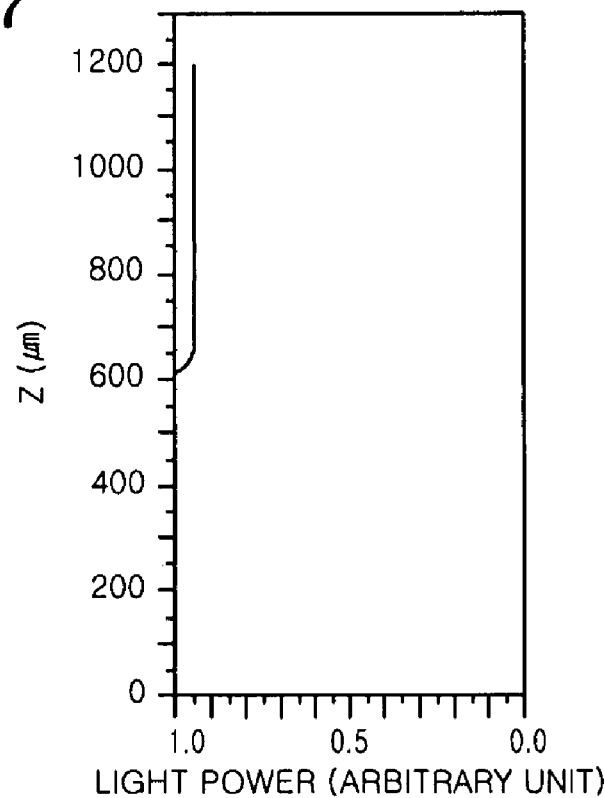

FIGS. 6 and 7 are graphs illustrating a light waveguide profile and coupling loss when the waveguide PIN photodiode of the present invention is coupled to a silica PLC waveguide. Referring to FIGS. 6 and 7, the same reference numerals are used for the elements shown in FIG. 1.

In detail, since the waveguide PIN photodiode according to the present invention can be used to manufacture a light signal receiver through coupling using flipchip bonding with a PLC waveguide 72, a coupling loss of the PLC waveguide 72 is very important. FIG. 6 illustrates computations results of a light waveguide profile obtained using a computer program when the core layer 36 of the waveguide PIN photodiode of the present invention is coupled to the silica PLC waveguide 72.

FIG. 7 illustrates computations results of a coupling loss obtained using a computer program when the core layer 36 of the waveguide PIN photodiode of the present invention is coupled to the silica PLC waveguide 72. Referring to FIGS. 6 and 7, the silicon PLC waveguide 72 has a height 3.6 µm, a width 4.5 µm, and a refractive index difference between the core layer 72 and the cladding layer of the silicon PLC waveguide 72 is 0.022, and the cladding layer of the silica PLC waveguide 72 has a refractive index 1.444.

Referring to FIG. 6, the silica PLC waveguide 72 has a width similar to that of the core layer 36 of the PIN photodiode, and so has the shape of a single-mode optical fiber, and the light intensity at the center of the core layer 36 increases and decreases within an interval of about 200 µm. Therefore, the most effective length of the waveguide PIN photodiode according to the present invention may be about 200 µm. Also, referring to FIG. 7, assuming an interval 10 µm between the cross-section of the silica PLC waveguide 72 and that of the waveguide PIN photodiode, a low coupling loss of about 4% is achieved. In FIG. 7, light power 1.0 means that no coupling loss occurs.

Figure 8:
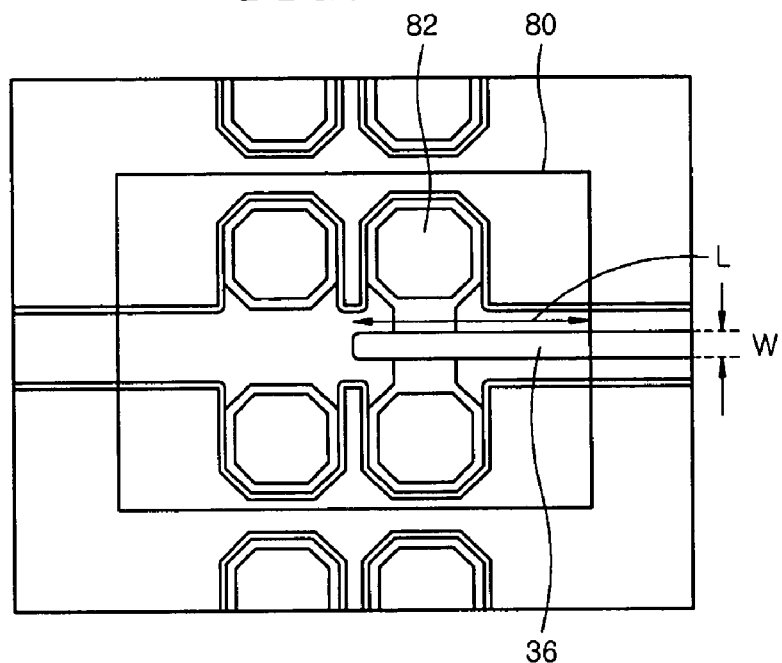
FIG. 8 is a view illustrating a manufactured waveguide PIN photodiode chip of the present invention.

FIG. 8 is a view illustrating a manufactured waveguide PIN photodiode chip of the present invention.

In detail, a rectangular portion indicated by a reference numeral 80 is one waveguide PIN photodiode chip. In FIG. 8, a reference numeral 82 is a pad portion. The waveguide PIN photodiode chip is manufactured with the optimized length L of the waveguide 36 (core layer) being 200 µm and the width W of the waveguide 36 being 20 µm. Since a single-mode optical fiber has a diameter of about 8 µm, the waveguide PIN photodiode chip according to the present invention may be designed with a margin.

The width W of the waveguide 36 may be determined with an appropriate size depending on a purpose with consideration of alignment tolerance with an optical fiber and the bandwidth of the photodiode. The waveguide PIN photodiode chip of FIG. 8 has a bandwidth 3.3 GHz, and a horizontal alignment tolerance 14 µm, which is a range from a maximum to 10% reduction of the maximum. A vertical alignment tolerance is 4.5 µm, which is a range from a maximum to 10% reduction of the maximum.

When used for a receiver of a PON network, which is local area optical network, the waveguide PIN photodiode chip illustrated in FIG. 8 has a main object bandwidth 2.5 GHz, and so the bandwidth and the alignment tolerance are appropriate. When the photodiode chip illustrated in FIG. 8 is used for a bandwidth 4 GHz or 5 GHz, the photodiode chip may be easily manufactured by appropriately reducing the width of the waveguide 36 to 13 µm or 16 µm.

Figure 9:
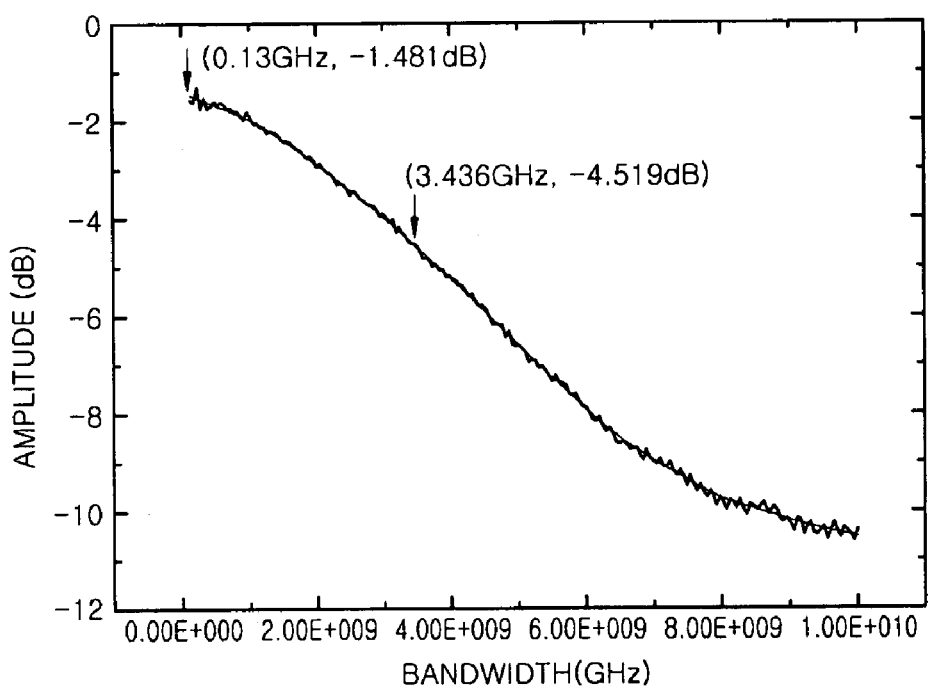
FIG. 9 is a graph obtained by measuring the bandwidth of a waveguide PIN photodiode of the present invention.

FIG. 9 is a graph obtained by measuring the bandwidth of a waveguide PIN photodiode of the present invention.

In detail, the waveguide PIN photodiode chip is attached to a sub-mounter, and then attached to a holding block where a single-mode fiber (SMF) connector is attached. After that, a bandwidth is measured using lightwave component analyzer (LCA). Measurement results show that a bandwidth at an initial measurement stage is 0.13 GHz, and a 3 dB-reduced bandwidth is 3.436 GHz. Therefore, the 3 dB bandwidth of the waveguide PIN photodiode chip is about 3.3 GHz.

As described above, the waveguide PIN photodiode has symmetrical graded index distribution centering around the light absorption layer and a maximum coupling coefficient when coupled to the plane-cut single-mode optical fiber or the silica waveguide.

Furthermore, the waveguide PIN photodiode according to the present invention has high responsivity, and thus it can used in a receiver of the local area optical network, has excellent alignment tolerance when coupled to the single-mode optical fiber, and may be manufactured with low package costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A waveguide PIN (p-type, intrinsic, n-type) photodiode comprising:
    a lower light guide layer comprising a plurality of lower-sub-light-guide-layers formed on a substrate, wherein each lower-sub-light-guide-layer has a refractive index different from the other lower-sub-light-guide-layers;
    a light absorption layer formed on the lower light guide layer;
    an upper light guide layer comprising a plurality of upper-sub-light-guide-layers formed on the light absorption layer, wherein each upper-sub-light-guide-layer has a refractive index different from the other upper-sub-light-guide-layers; and
    a cladding layer formed on the upper light guide layer,
    wherein the lower light guide layer, the light absorption layer, and the upper light guide layer constitute a core layer, which is an optical waveguide, and
    wherein the refractive indices of the lower-sub-light-guide-layers and the upper-light-guide-layers are symmetrical with respect to the light absorption layer having a highest refractive index.

2. The waveguide PIN photodiode of claim 1, wherein the symmetrical refractive indices approximate a graded index distribution having a curve shape of a Lorentz function.

3. The waveguide PIN photodiode of claim 1, wherein the plurality of lower-sub-light-guide-layers include an n-diluted index layer formed on the substrate, an n-1.1Q layer formed on the n-diluted index layer to have a higher refractive index than that of the n-diluted index layer, and a lower u-1.3Q layer formed on the n-1.1Q layer to have a higher refractive index than the n-1.1Q layer; and
    wherein the plurality of upper-sub-light-guide-layers include the upper light guide layer comprises an upper u-1.3Q layer formed on the light absorption layer, a p-1.1Q layer formed on the upper u-1.3Q layer to have a lower refractive index than the upper u-1.3Q layer, and a p-diluted index layer formed on the p-1.1Q layer to have a lower refractive index than the p-1.1Q layer.

4. The waveguide PIN photodiode of claim 3, wherein the upper u-1.3Q layer and the lower u-1.3Q layer have the same refractive index, the p-1.1Q layer and the n-1.1Q layer have the same refractive index, and the p-diluted index layer and the n-diluted index layer have the same refractive index.

5. The waveguide PIN photodiode of claim 3, wherein the n-diluted index layer comprises a semiconductor layer formed by stacking a plurality of pairs of layers, each pair consisting of a material layer of the substrate and a material layer of the n1.1Q layer and controlling a refractive index; and the p-diluted index layer comprises a semiconductor layer formed by stacking a plurality of pairs of layers, each pair consisting of a material layer of the cladding layer and a material layer of the p-1.1Q layer.

6. The waveguide PIN photodiode of claim 3, wherein the n-diluted index layer and the n-1.1Q layer comprise semiconductor layers (n-type semiconductor layers) doped with n-type impurities;

the lower u-1.3Q layer, the light absorption layer, and the lower u-1.3Q layer comprise intrinsic semiconductor layers (i-layers) undoped with impurities; and the p-diluted index layer and the p-1.1Q layer comprise semiconductor layers (p-type semiconductor layers) doped with p-type impurities.

7. The waveguide PIN photodiode of claim 6, wherein the thicknesses of the intrinsic semiconductor layers are 0.1-5 µm.

8. The waveguide PIN photodiode of claim 1, wherein the thickness of the light absorption layer is 0.1-1 µm, the length of the optical waveguide (core layer) is 100-250 µm, and the width of the optical waveguide is 8-30 µm.

9. The waveguide PIN photodiode of claim 1, wherein the thickness of the core layer is 3-5 µm.

* * * * *